(12) United States Patent
Bezama et al.

(10) Patent No.: US 6,276,246 B1
(45) Date of Patent: Aug. 21, 2001

(54) METHOD FOR PUNCHING SLUG FROM WORKPIECE

(75) Inventors: Raschid J. Bezama, Mahopac; Laertis Economikos, Wappingers Falls; Mark J. LaPlante, Walden; David C. Long, Wappingers Falls; Keith C. O'Neil, Hughsonville, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/411,575

(22) Filed: Oct. 4, 1999

Related U.S. Application Data

(62) Division of application No. 08/904,339, filed on Jul. 31, 1997, now Pat. No. 6,003,418.

(51) Int. Cl.[7] .................................................. B26D 7/18
(52) U.S. Cl. .......................... 83/24; 83/98; 83/99; 83/100
(58) Field of Search .......................... 83/98, 99, 100, 83/24

(56) References Cited

U.S. PATENT DOCUMENTS

| | | | |
|---|---|---|---|
| 2,391,304 | 12/1945 | Fink | 83/100 X |
| 2,976,754 | 3/1961 | Wennes | 83/98 X |
| 3,088,353 | * 5/1963 | Hanington | 83/24 |
| 3,550,491 | 12/1970 | Wingard | 83/99 X |
| 3,710,666 | 1/1973 | Keyes et al. | 83/99 |
| 3,822,622 | 7/1974 | Smith et al. | 83/100 |
| 4,425,829 | 1/1984 | Kranik et al. | 83/62.1 |
| 4,628,780 | 12/1986 | Hicks | 83/98 X |
| 4,633,743 | 1/1987 | Ichikawa | 83/100 |
| 4,821,614 | 4/1989 | Fleet et al. | 83/100 |
| 5,111,723 | 5/1992 | Andrusch et al. | 83/24 |
| 5,214,991 | 6/1993 | Shimizu e tal. | 83/168 |
| 5,358,593 | * 10/1994 | Hamuro et al. | 83/100 X |
| 5,613,416 | 3/1997 | Fujita | 83/98 |
| 5,782,152 | 7/1998 | Reis et al. | 83/100 X |
| 5,906,702 | 5/1999 | Crawford, Jr. et al. | 83/100 X |
| 5,907,985 | 6/1999 | Bezama et al. | 83/98 X |
| 6,024,003 | * 2/2000 | Newman et al. | 83/24 |

FOREIGN PATENT DOCUMENTS

| | | |
|---|---|---|
| 17446 | of 1908 | (GB) . |
| 5-57687 | 3/1993 | (JP) . |
| 5-261454 | 10/1993 | (JP) . |

OTHER PUBLICATIONS

Beam et al., "Vacuum Slug–Removal Apparatus," Western Electric Technical Digest, No. 58, pp. 5–6 (Apr. 1980).

* cited by examiner

Primary Examiner—Charles Goodman
(74) Attorney, Agent, or Firm—Ratner & Prestia; Ira D. Blecker, Esq.

(57) ABSTRACT

A punched slug removal system for punching a slug from a workpiece and removing the punched slug. The system includes a punch having a reciprocating travel path with a transition point where the punch changes direction. A die plate has an aperture into which a die bushing may be disposed. The die bushing provides support for the workpiece and has an opening through which the punch and a slug pass. A manifold supports the die plate and (if present) the die bushing and has a distribution channel and an orifice which direct a gas flow onto a slug attached to the punch in a direction perpendicular to the reciprocating travel path of the punch to remove the slug from the punch. The distribution channel is tapered to increase the velocity of the gas flow. The orifice is positioned at the top of the manifold adjacent the transition point of the reciprocating travel path of the punch. The manifold extends into the aperture of the die plate, reducing the cross sectional area of the aperture, and has a step formed under the punch. The system also includes a vacuum, offset relative to the punch and applied to the side of the punch opposite the orifice, to enhance removal of slugs from the punch.

16 Claims, 4 Drawing Sheets

METHOD FOR PUNCHING SLUG FROM WORKPIECE

This application is a divisional of U.S. patent application Ser. No. 08/904,339, filed on Jul. 31, 1997, now U.S. Pat. No. 6,003,418.

TECHNICAL FIELD

The present invention relates generally to a punch which forms holes in thin sheet material and, more particularly, to an improved punch with a positive slug removal feature to facilitate punching in materials such as green ceramic sheets.

BACKGROUND OF THE INVENTION

A plurality of unfired (green) ceramic sheets or tapes are used in the manufacture of multilayer ceramic substrates for integrated circuit semiconductor package structures. Via holes are punched in the ceramic green sheets to form the paths for electrical interconnections through the sheets. The step of punching the via holes in ceramic green sheets presents formidable engineering problems in view of the small size and density of the holes and of the complex hole patterns needed. The sheets themselves are typically thin: only about 0.2 mm (8 mils) thick.

It is convenient to punch via holes with a tool of the type disclosed in U.S. Pat. No. 4,425,829 issued to Kranik et al. In this type of tool, a plurality of punch elements are arranged in a grid on a punch head and are indexed over the green sheet which is covered by an interposer mask. The interposer mask contains openings where holes will be punched. When the punch elements contact the interposer mask, as the punch head is moved downwardly, a hole will be punched where the openings occur because the punch element will pass through the openings in the interposer mask and then through the ceramic green sheet. In other areas covered by the interposer mask (i.e., where holes are not desired), the interposer mask will cause the punch element to be retracted into the head. The green sheet is sequentially indexed through a predetermined number of positions to complete the punching of a sheet.

It is essential that the punching operation produce products free from defects. A single defect can potentially render a green sheet unsuitable for further processing. It is also essential that the punching operation be rapidly and accurately performed. Each green sheet can contain over 100,000 punched holes. Of particular concern is the adherence to the tip of the punch of a slug punched from the sheet. The inherent adhesion characteristics of the unfired green sheet are amplified by the large punching force applied over the small area of the punch tip. The diameter of the punch tip can be as small as 0.13 to 0.15 mm (5 to 6 mils) in current application and is expected to be 0.10 mm (4 mils) or less for advanced substrates, resulting in a pressure at the punch tip on the order of 2,700 kg/cm$^2$. If the punch slug adheres to the punch, the slug may be drawn back into the punched hole, causing a substrate defect. To eliminate the likelihood of such defects, it has been standard practice to use two punch strokes for each hole. This practice greatly increases green sheet processing time.

The problem of slug adhesion to the punch is not limited to the punching of ceramic green sheets; rather, the problem has been discussed in other punching application references. One method adopted in punching apparatus for the removal of punch slugs is the use of either pressurized air or a vacuum to force the slug from the punch. Certain references disclose apparatus in which air is channeled through the punch to remove the slug from the tip of the punch. An example of such a reference is U.S. Pat. No. 4,628,780 issued to Hicks. This method is not practical, however, for punching extremely small diameter holes. Other applications either direct air into or apply a vacuum to a chamber below the punch to clear the slugs and do not directly address the problem of slug adherence.

The use of air flow slug removal methods in ceramic green sheet punching to achieve single stroke punching is disclosed in U.S. Pat. No. 5,111,723 issued to Andrusch et al. and U.S. Pat. No. 4,425,829 issued to Kranik et al. Kranik et al. teach a tube protruding into the die bushing which upwardly injects air into the die cavity below the punching area. This air flow induces circulation in the die bushing cavity which assists in forcibly removing slugs from the punch. The arrangement does not provide the repeatability necessary to achieve single stroke punching.

Andrusch et al. teach a single stroke punch apparatus which includes a punch and a bushing retention die plate. A support bushing is mounted in the die plate and provides support for the workpiece. The support bushing has a clearance for a punch. The apparatus also has a nozzle (or "slug removal bushing") mounted in the die plate which provides an internal passage for the removal of punch slugs from the apparatus. A slug is punched from the workpiece through an opening in an end wall of the support bushing disposed in an aperture of the die plate. The nozzle, the support bushing, and the bushing retention die plate define a flow passage allowing gas to flow in the die plate to the opening in the support bushing. The flow passage includes a slot clearance between the end wall at the top of the nozzle and the support bushing. The gas flow impinges on the slug attached to the punch tip proximate to the end wall of the support bushing and at the top of the nozzle to remove the slug from the punch through a slug removal passage in the nozzle.

The shape of the slot clearance helps to direct the gas flow downward and away from the punch and the green sheet. U.S. Pat. No. 5,111,723 at column 5, lines 36–37. Therefore, the gas flow is parallel to the direction of travel of the punch and slug when the gas flow impinges on the slug attached to the punch tip. The tangential force of the gas flow on the slug is sometimes insufficient to blow the slug from the punch tip. In addition, the slot clearance prevents a sealed surface between the support bushing and the nozzle, thus allowing the rapid expansion of gas (air) as it enters the region immediately below this interface. Without a sealed interface, the gas tends to expand too quickly into the volume surrounding the punch tip and slug and is sometimes ineffective for blowing the slug from the punch tip.

These same problems arise for the punching tool disclosed in Japan Patent No. 5-057687 issued to Takumi et al. The die bushing of the punching tool has an air lead groove and an air passage port formed in its periphery. The die bushing also has a central hole into which the punch and slug pass. Air flows inward from the periphery of the die bushing and toward the punch through the air passage port. The air passage port is formed obliquely so that it directs the air flow downward and at a tangential angle into the central hole of the die bushing and onto the punch. In addition, the air rapidly expands in the central hole of the die bushing once it leaves the air passage port.

The punching tool disclosed in Japan Patent No. 5-261454 issued to Tomohiro similarly incorporates a slanted bore in the periphery of the die bushing. The angle of the bore is specifically set at about 10–80 degrees to assure that the air flow is directed downward toward the punch. The diameter of the bore is 1 mm or less and the force of the air flow is apparently 0.5 to 5 kg.

U.S. Pat. No. 5,214,991 issued to Shimizu et al. discloses a punching apparatus in which compressed air is made to flow at high speed parallel to the direction of travel of the punch and through the hole just formed by the punch in the green sheet. A gap is formed between the punch pin and the peripheral wall of the opening (through which the punch passes) in the stripper member disposed above the green sheet. The air flows downward through that gap where it is then sucked toward the base of the die by a suction mechanism. The downward air flow can blow a slug off the punch tip and carry the slug toward the suction mechanism.

Although the configurations discussed above have been useful in removing slugs from the punch tip, none of the configurations provide the 100% slug removal which is required for single stroke punching. A 99.9% slug removal rate on a green sheet containing 100,000 holes results in 100 defects per sheet, any one of which renders the sheet unacceptable for further processing. The problem can be further appreciated by considering that a defect may not be detected until the green sheet is laminated into a substrate containing 60 or more layers. Thus, the conventional tools used to remove a punch slug are not effective to the degree needed when punching 0.2 mm (8 mils) thick green sheets in high volume manufacturing. The slug that is punched out is not always removed, resulting in via blockage.

The deficiencies of the conventional punch configurations show that a need still exists for a system which will precisely direct an air flow at a punch tip to remove the punch slug and thus allow single stroke punching. To overcome the shortcomings of the conventional punch configurations, a new punched slug removal system is provided. An object of the present invention is to provide a single stroke punch system which offers improved punch slug removal.

Another object is to avoid a design in which a separate converging-diverging nozzle fits within the die bushing of the punch tool to achieve air flow velocities sufficient to remove the slug from the punch tip. Yet another object is to avoid a design in which air flow passages are formed through the punch, the punch bushing, the die bushing, or the die plate. A related object is to reduce the cost required to build and maintain a punched slug removal system.

It is a further object of the present invention to provide a punched slug removal system which precisely directs an air flow at the slug adhered to a punch tip. Another object is to assure that the maximum force of the air flow is applied to the adhered slug for the maximum length of time, thus making the air flow more effective. It is still another object of the present invention to prevent the rapid expansion of the gas which reduces the effectiveness of the gas for blowing off the slug.

SUMMARY OF THE INVENTION

To achieve these and other objects, and in view of its purposes, the present invention provides a punched slug removal system for punching a slug from a workpiece and removing the punched slug. The system includes a punch having a linear reciprocating travel path with a transition point where the punch changes direction (i.e., the transition point is defined as the point in the reciprocating travel path where the punch changes direction at the end of its downward travel and before it begins its upward travel, the precise point of reciprocation). A die plate has an aperture into which a die bushing may be disposed. The die bushing provides support for the workpiece and has an opening through which the punch and a slug pass. A manifold supports the die plate and (if present) the die bushing and has a distribution channel and an orifice which direct a gas flow onto a slug attached to the punch in a direction perpendicular to the reciprocating travel path of the punch to remove the slug from the punch. The distribution channel is tapered to increase the velocity of the gas flow. The orifice is positioned at the top of the manifold adjacent the transition point of the reciprocating travel path of the punch. The manifold extends into the aperture of the die plate, reducing the cross sectional area of the aperture, and has a step formed under the punch. The system also includes a vacuum, applied to the side of the punch opposite the orifice and offset relative to the punch, to enhance removal of slugs from the punch.

The invention also encompasses a method for punching which includes providing a workpiece proximate a surface of a die plate defining an aperture. The method further includes punching a slug from the workpiece through the aperture. A gas flow is directed through a distribution channel defined in a manifold supporting the die plate. The gas flow impinges on the slug attached to the punch in a direction perpendicular to the reciprocating travel path of the punch to remove the slug from the punch.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 5:
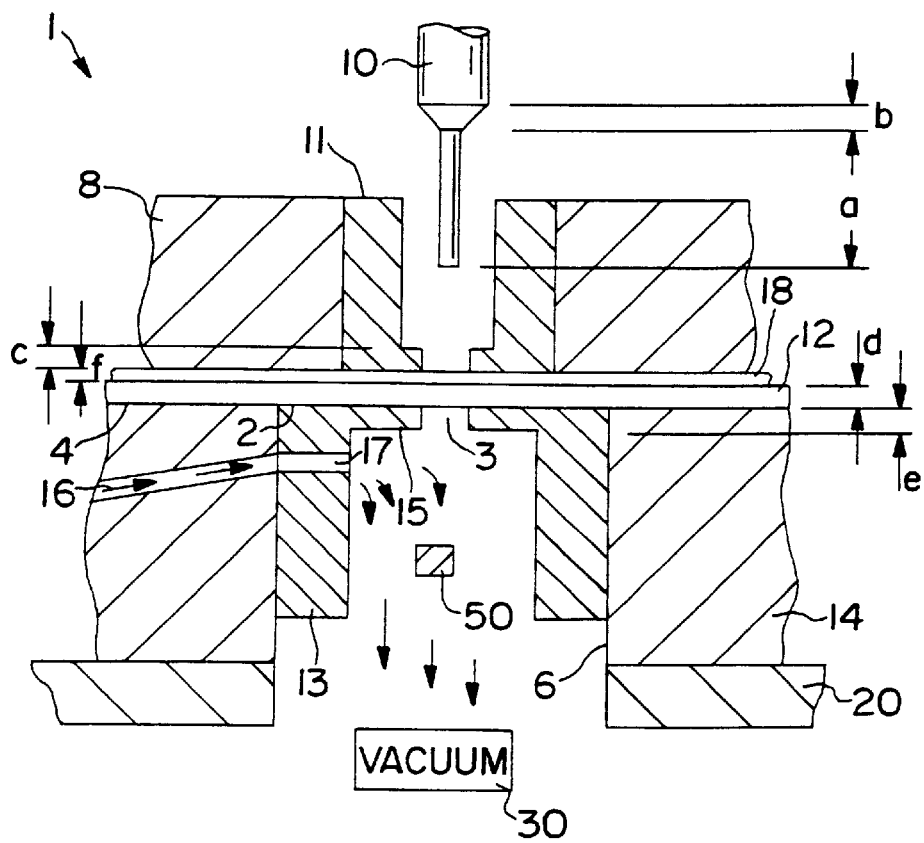
FIG. 5 is a cross-section of a conventional slug removal and punch apparatus.

Referring now to the drawing, wherein like reference numerals refer to like elements throughout, FIG. 5 shows a cross-section of a conventional slug removal and punch apparatus. As illustrated, apparatus 1 of FIG. 5 includes a punch 10. Although punch 10 may be an individual punch, it is preferably one of multiple punches in a punch head as shown in U.S. Pat. No. 4,425,829 issued to Kranik et al. Punch 10 is located in punch housing 8 by punch bushing 11. Punch 10 punches a workpiece 12, which in a preferred embodiment is a ceramic green sheet, removing punch slug 50. (The present invention works with workpiece materials other than green sheets.) Slug 50 often adheres to the end or tip of punch 10. An interposer 18 defining a punch pattern may be placed between punch housing 8 and workpiece 12 if spacing allows.

A die plate (or die shim) 14 defines an aperture (or bushing receiving feature) 6. In the preferred multiple punch embodiment, die plate 14 forms a series of apertures 6 which open on the surface 4 of die plate 14 which faces workpiece 12. Die plate 14 also includes a port 16 for introducing gas flow into aperture 6. The gas may be any type of gas suitable for removing punch slug 50 from punch 10. Although compressed air is preferably used for slug removal, compressed nitrogen is also suitable.

Apparatus 1 of FIG. 5 has a die bushing 13 which supports workpiece 12. Die bushing 13 is pressed into die plate 14 and, specifically, is mounted in aperture 6. The top 15 of die bushing 13 has a workpiece supporting surface 2 which includes an opening 3 providing clearance for punch 10 and attached slug 50. Workpiece 12 rests on die bushing 13 rather than on die plate 14, which prevents marring damage to workpiece 12. In the multiple punch configuration, of course, a whole series of die bushings 13 define the support surface 2 on which workpiece 12 rests.

Port 16 in die plate 14 meets passage 17 in die bushing 13 to form a flow path for the gas flow. A manifold 20 may be provided under die plate 14. A vacuum 30 may be provided both to direct the gas flow and to facilitate removal of slug 50 from apparatus 1.

The conventional slug removal and punch apparatus illustrated in FIG. 5 discloses injecting air from passage 17 in die bushing 13 to remove slug 50 from punch 10. This arrangement has not provided the repeatability necessary to achieve single stroke punching. The usable length "at" of punch 10 is limited by the difficulty of fabricating an accurate, small diameter punch 10 suitable for the rigors of production punching and by the requirement of machining radius "b." This usable length must extend through wall thickness "c" of punch bushing 11, workpiece 12 thickness "d," and the wall thickness "e" of die bushing 13. The accumulation of these dimensions and accompanying tolerances results in a minimal protrusion of the punch beyond top 15 of die bushing 13. It is very difficult to cause passage 17 to direct air precisely at top 15 because of the required wall thicknesses and tolerances involved. In particular, the necessary alignment of passage 17 in die bushing 13 with port 16 in die plate 14 creates tolerance problems and renders alignment and assembly more difficult. These problems are aggravated in a non-programmable multiple punch which, in addition to the components already discussed, requires interposer 18 having a thickness "f."

Figure 1:
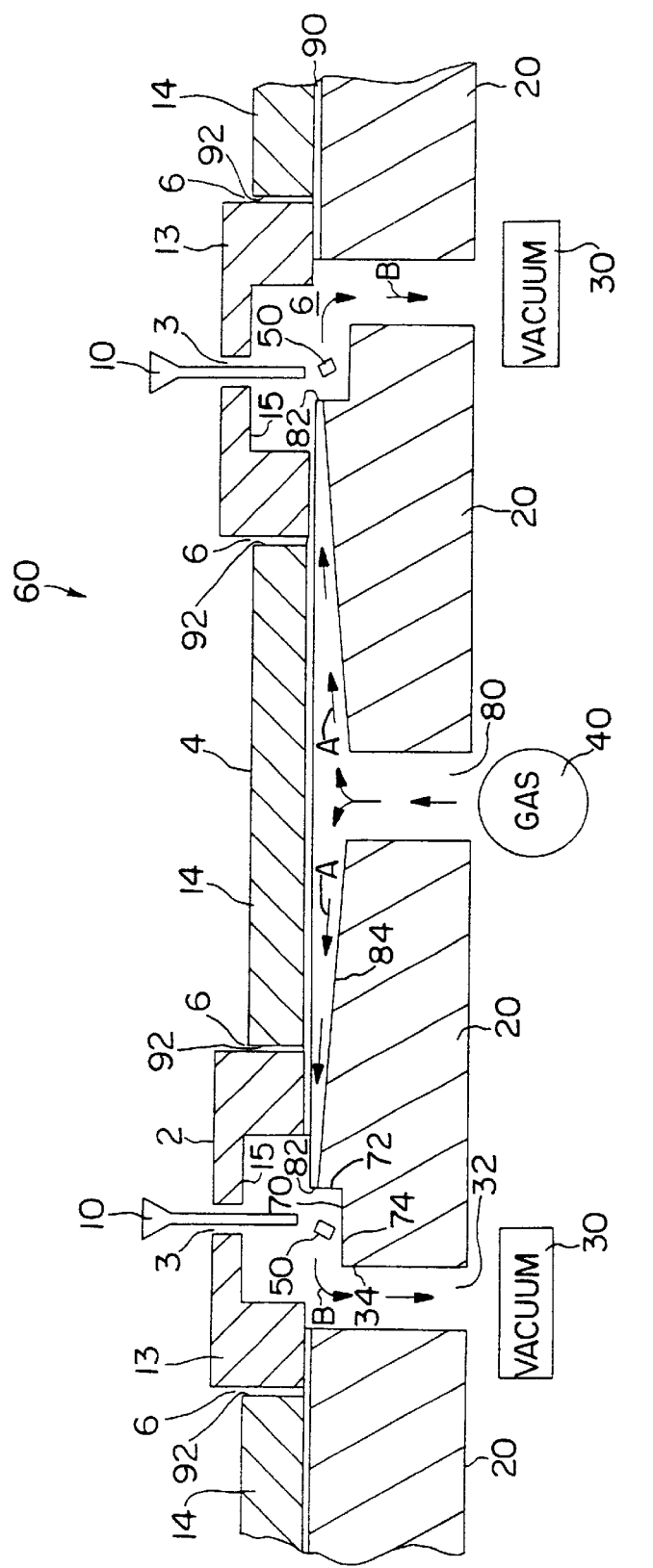
FIG. 1 is a cross-section of the slug removal elements and punch tool of the present invention.

Turning to FIG. 1, a cross-section of the slug removal elements and punch tool of the punched slug removal system 60 of the present invention is shown. System 60 for accomplishing the slug removal operation includes a plurality of punches 10, a corresponding plurality of die bushings 13, a die plate 14, and a manifold 20. Die bushings 13 are preferably tungsten carbide and have a thickness of about 0.8 mm (32 mils). Die plate 14 is typically 0.5 mm (20 mils) thick molybdenum or stainless steel. Punch 10 forces the ceramic material or workpiece 12 (not shown) into opening 3 of die bushing 13, causing the ceramic to fracture and dislodge at the interface between punch 10 and die bushing 13. Die plate 14 serves two purposes: it retains die bushing 13 at a fixed position relative to punch 10 and covers the distribution channels 80 in manifold 20 when die plate 14 and manifold 20 are assembled together. Manifold 20 supports die plate 14 and die bushings 13 and allows the distribution of high pressure fluid (gas) and vacuum for slug removal. An adhesive 90 having a maximum thickness of about 0.025 mm (1 mil) may be disposed between manifold 20 and die plate 14 and each of die bushings 13. Die bushings 13 are retained in die plate 14 both by a press fit and by adhesive 92.

Figure 2:
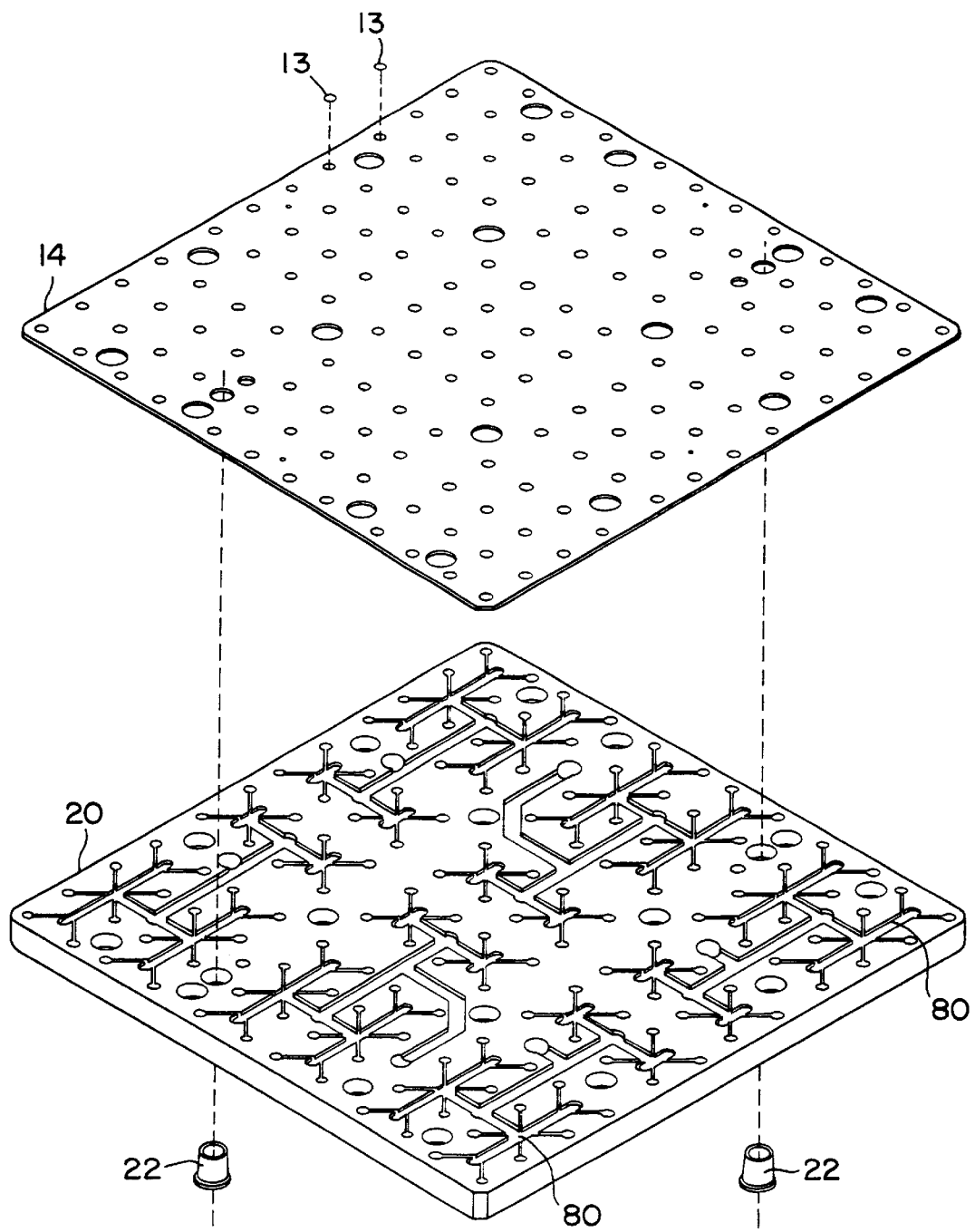
FIG. 2 is a perspective view of the die bushing, die plate, and manifold forming the die assembly according to the present invention, with the components separated for clarity.

FIG. 2 is a perspective view of die bushings 13, die plate 14, and manifold 20 forming the die portion of system 60 according to the present invention. The components have been separated in FIG. 2 for clarity. Sleeves 22 are provided to facilitate alignment and joining of the components. For the embodiment illustrated, and for purposes of example only, there are 144 die bushings 13. A plurality of distribution channels 80 are provided in manifold 20. Fluid flow through each distribution channel 80 and the force induced by the fluid flow removes slug 50 from the tip of punch 10 as described more fully below.

A comparison of FIGS. 1 and 5 illustrates the improvements achieved by the present invention. Specifically, port 16 in die plate 14 and passage 17 in die bushing 13 have been replaced by distribution channel 80 ending in an orifice 82 in manifold 20. Orifice 82 is precisely located at or near the top of manifold 20 as illustrated in FIG. 1. The location of orifice 82 in manifold 20, and not in another component such as the die plate, the die bushing, the punch, or the punch bushing has several advantages.

The improved placement of orifice 82 in manifold 20 allows a jet of fluid to impinge upon slug 50 that is attached to the tip of punch 10 while punch 10 is in the transition point of its reciprocating travel. Fluid flow hits the tip of punch 10 at the very bottom of its stroke (bottom dead center)—at precisely the best point in the travel of punch 10—assuring that fluid impinges on the tip of punch 10 and slug 50, if slug 50 has adhered to the tip, for the maximum time. Thus, fluid is introduced through orifice 82 at the top of manifold 20 and not through another component or another location. Orifice 82 is provided at a most efficient location where the fluid blast impinges directly on slug 50 at the point of maximum stroke of punch 10.

Distribution channel 80 has a "T"-shape and is provided with a taper 84 so that the minimum cross section of distribution channel 80 exists at orifice 82. The cross section of orifice 82 is about 0.20 to 0.38 mm (8 to 15 mils) square. Orifice 82 is positioned at the end of the "head" of the T-shaped distribution channel 80. The cross section near the midpoint of each leg of the head is about 0.75 mm (30 mils) square. The maximum size of distribution channel 80, exhibited by the "tail" of the T-shaped distribution channel 80, is about 3.175 mm (125 mils). The tapered configuration increases the velocity of the fluid exiting orifice 82 and avoids the need for a separate nozzle component. The specific configuration of distribution channel 80 shown in FIG. 1 is preferred.

Orifice 82 is positioned close to the vertical travel path of punch 10. Preferably, orifice 82 is about 0.125 mm (5 mils) from the vertical travel path of punch 10. Such proximity helps to assure the perpendicular direction of the fluid flow upon impact with punch 10 and slug 50 and, therefore, increases the force of the fluid flow on those elements.

The improved design of manifold 20 according to the present invention increases the maximum force on the tip of punch 10 and slug 50 over conventional designs. For the same pressure drop of 80 psi, the design of the present invention induces a force more than 30% greater than the force induced by conventional designs. Therefore, the design of the present invention is more effective in removing slug 50 from punch 10. In addition, the design of the present invention applies the maximum force for a longer time, also making it more effective.

When punch 10 passes through workpiece 12 (not shown), slug 50 enters the fluid flow just below the top 15 of die plate 14 and is removed by the fluid traveling perpendicular (ninety degrees) to the direction of travel of punch 10 and slug 50. The perpendicular impact of the fluid on slug 50 is important; such impact maximizes the force component of the fluid on slug 50.

The fluid is preferably a gas. The gas may be compressed air, nitrogen, or other suitable gas provided by a compressed gas source 40. The gas leaves source 40 and enters distribution channel 80 in the tail of T-shaped distribution channel 80. At the junction between the tail and head of T-shaped distribution channel 80, the gas divides to form a gas flow A directed toward separate punches 10 through manifold 20. Gas flow A exits distribution channel 80 and manifold 20 at orifice 82, impinging on punch 10 and slug 50. The gas flow is then pulled perpendicularly across punch 10 and slug 50 in aperture 6 by a vacuum 30 forming gas flow B in a vacuum channel 32 having a side wall 34. Vacuum 30 is positioned on the side of punch 10 opposite both orifice 82 and the impinging gas flow A. Subsequently, slug 50 is pulled via gas flow B into a debris collector (not shown).

The diameter of vacuum channel 32 is about 3.175 mm (125 mils). Gas source 40, distribution channels 80, apertures 6, vacuum channels 32, and vacuum 30 form a closed, sealed subsystem for the gas used in punched slug removal system 60. The sealed subsystem provides a constant flow of gas for removal of slugs 50. Moreover, the flow is precisely directed and does not simply fill the volume of aperture 6.

The center of vacuum channel 32 is specifically located off-center relative to punch 10. In other words, vacuum channel 32 is not positioned directly under and concentric with punch 10. Rather, vacuum channel 32 is offset relative to punch 10. This configuration assures that the gas flow will be pulled perpendicularly across punch 10 and slug 50 and will not change direction until the gas flow has gone beyond punch 10 and slug 50.

Manifold 20 of the present invention extends part-way under die bushing 13, filling some of the area under die bushing 13 and reducing the volume of the region extending under die bushing 13. This reduced volume allows for higher fluid force near the tip of punch 10 while keeping the total pressure drop across this region at acceptable levels. The rapid expansion of gas (air) as the gas enters this region is reduced relative to conventional designs. For the larger volume under die bushing 13 shown in FIG. 5, for example, the gas may expand too quickly and may be ineffective for blowing slug 50 off the tip of punch 10.

Figure 3:
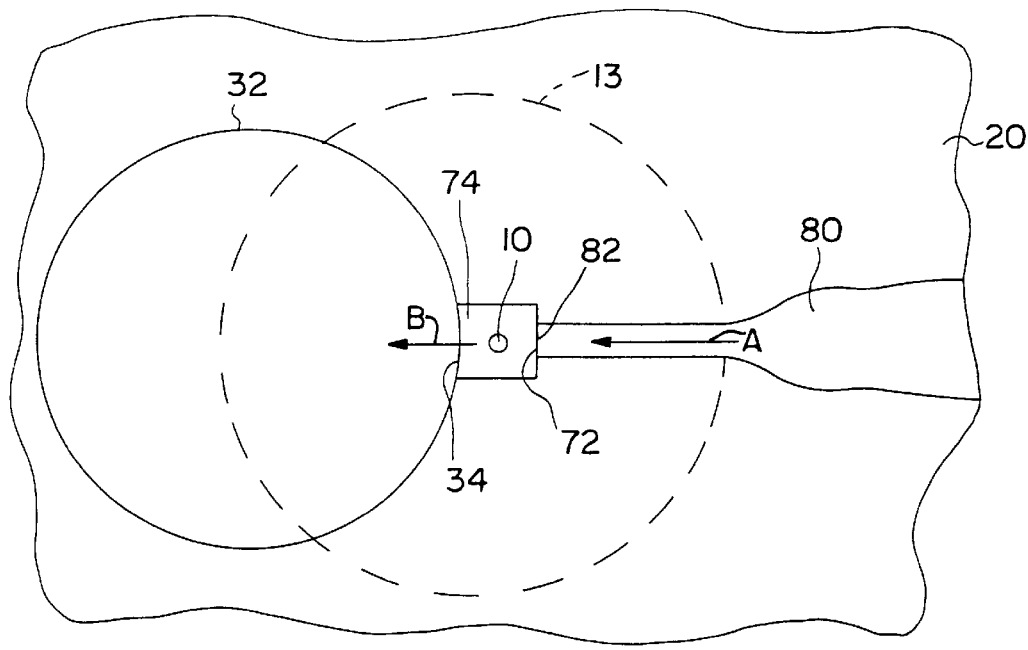
FIG. 3 is a top view of the region extending from the orifice of the distribution channel to the side wall of the vacuum channel of the die assembly illustrated in FIG. 2.

The extension of manifold 20 under die bushing 13 requires that a step 70 be formed in manifold 20 to provide clearance for punch 10 and slug 50. Step 70 also allows an accidentally broken punch to fall and be swept away by gas flow B (along with slug 50) to the debris collector, allowing easy maintenance. Step 70 has a height 72 of about 0.75 mm (30 mils) and a width 74 of about 1.7 mm (68 mils) The interconnection between distribution channel 80, step 70, and vacuum channel 32 is further illustrated in FIG. 3. Specifically, FIG. 3 is a top view of the region extending from orifice 82 of distribution channel 80 to side wall 34 of vacuum channel 32 of the die assembly illustrated in FIG. 2.

Figure 4:
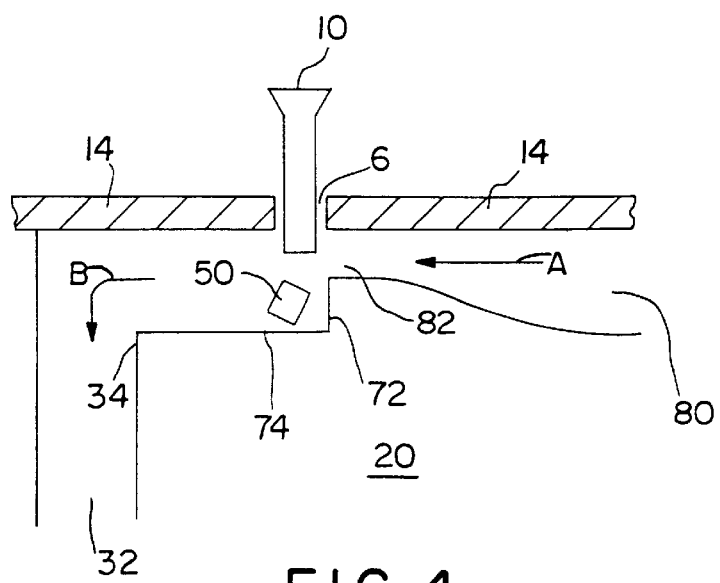
FIG. 4 is a perspective view of the die plate and manifold forming the die assembly without a die bushing according to an alternative embodiment of the present invention.

FIG. 4 is a perspective view of die plate 14 and manifold 20 forming the die assembly without die bushing 13 according to an alternative embodiment of the present invention. In this embodiment, aperture 6 of die plate 14 may be made smaller than aperture 6 of the embodiment shown in FIG. 1. Die plate 14 rather than die bushing 13 provides support for the workpiece. Punch 10 and slug 50 pass through aperture 6 only rather than through both aperture 6 of die plate 14 and opening 3 of (non-existent) die bushing 13. Otherwise, the relationship between the components of FIG. 4 corresponds to the relationship between the same components of FIG. 1.

Implementation of the present invention allows single stroke punching. The invention essentially provides positive 100% punch slug removal, with minimal defective sheets, when used for punching ceramic green sheets and provides significant process time improvement over the previously practiced punching methods. The present invention avoids a separate converging-diverging nozzle, often placed within the die bushing of conventional punch tools to achieve air flow velocities sufficient to remove the slug from the punch tip. The present invention also avoids air flow passages in components such as the punch, the punch bushing, the die bushing, and the die plate. Consequently, the design of the present invention reduces the cost required to build and maintain punched slug removal system 60.

The method for removing workpiece slugs 50 from a punch 10 allowed by the punched slug removal system 60 of the present invention includes the steps of providing a workpiece 12 proximate a surface 4 of a die plate 14 defining an aperture 6; punching a slug from the workpiece through an opening 3 in a die bushing 13 disposed in the aperture 6; directing a gas flow "A" through a distribution channel 80 defined in a manifold 20 supporting the die plate and the die bushing; and impinging the gas flow on the slug attached to the punch in a direction perpendicular to the reciprocating travel path of the punch to remove the slug from the punch. The method may also include inserting an interposer 18 defining a desired punch pattern between the punch and the workpiece. Assistance in punch slug removal may be provided by applying a vacuum 30 on the side of the punch opposite the impinging gas flow to draw the gas flow across the punch in a direction perpendicular to the reciprocating travel path of the punch.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A method for punching which comprises the steps of:
   providing a workpiece proximate a surface of a die plate defining an aperture having a cross-sectional area;
   punching a slug from the workpiece through the aperture using a punch having a first side, a second side, and a linear reciprocating travel path with a transition point where the punch changes linear direction;
   directing a gas flow having a velocity through a distribution channel and an orifice defined in a manifold having a substantially planar top surface directly supporting the die plate; and
   impinging the gas flow on the slug attached to the punch in a direction perpendicular to the reciprocating travel path of the punch, on the first side of the punch, and adjacent the transition point of the reciprocating travel path of the punch to remove the slug from the punch, wherein the orifice is positioned at the top surface of the manifold adjacent the transition point of the reciprocating travel path of the punch.

2. The method of claim 1 further comprising the step of applying a vacuum offset relative to the punch, the vacuum enhancing removal of the slug from the punch.

3. The method of claim 2 wherein the vacuum is applied on the second side of the punch opposite the impinging gas flow to draw the gas flow across the punch in the direction perpendicular to the reciprocating travel path of the punch.

4. The method of claim 1 further comprising the step of inserting an interposer defining a desired punch pattern between the punch and the workpiece.

5. The method of claim 1 further comprising the step of increasing the velocity of the gas flow through a tapered distribution channel.

6. The method of claim 1 further comprising the step of reducing the cross-sectional area of the aperture by extending the manifold into the aperture of the die plate.

7. The method of claim 1 further comprising the step of providing the manifold with a step formed under the punch.

8. The method of claim 1 further comprising the step of providing a die bushing supported by the manifold and disposed in the aperture of the die plate, the die bushing supporting the workpiece and having an opening through which the punch and the slug pass.

9. The method of claim 8 further comprising the step of adhering each of the die plate and the die bushing to the manifold.

10. A method for punching which comprises the steps of:
providing a workpiece proximate a surface of a die plate defining an aperture having a cross-sectional area;
punching a slug from the workpiece through the aperture using a punch having a first side, a second side, and a linear reciprocating travel path with a transition point where the punch changes linear direction;
directing a gas flow having a velocity through a distribution channel and an orifice defined in a manifold having a substantially planar top surface directly supporting the die plate;
providing a die bushing supported by the manifold and disposed in the aperture of the die plate, the die bushing supporting the workpiece and having an opening through which the punch and the slug pass;
impinging the gas flow on the slug attached to the punch in a direction perpendicular to the reciprocating travel path of the punch, on the first side of the punch wherein the orifice is positioned at the top surface of the manifold adjacent the transition point of the reciprocating travel path of the punch, and adjacent the transition point of the reciprocating travel path of the punch to remove the slug from the punch, wherein the orifice is positioned at the tip surface of the manifold adjacent the transition point of the reciprocation travel path of the punch; and
applying a vacuum offset relative to the punch, the vacuum enhancing removal of the slug from the punch.

11. The method of claim 10 further comprising the step of inserting an interposer defining a desired punch pattern between the punch and the workpiece.

12. The method of claim 10 wherein the vacuum is applied on the second side of the punch opposite the impinging gas flow to draw the gas flow across the punch in the direction perpendicular to the reciprocating travel path of the punch.

13. The method of claim 10 further comprising the step of increasing the velocity of the gas flow through a tapered distribution channel.

14. The method of claim 10 further comprising the step of reducing the cross-sectional area of the aperture by extending the manifold into the aperture of the die plate.

15. The method of claim 10 further comprising the step of providing the manifold with a step formed under the punch.

16. The method of claim 10 further comprising the step of adhering each of the die plate and the die bushing to the manifold.

* * * * *

UNITED STATES PATENT AND TRADEMARK OFFICE
CERTIFICATE OF CORRECTION

PATENT NO. : 6,276,246 B1
DATED : August 21, 2001
INVENTOR(S) : Raschid J. Bezama et al.

It is certified that error appears in the above-identified patent and that said Letters Patent is hereby corrected as shown below:

<u>Column 10, claim 10,</u>
Line 12, delete "tip" and insert -- top --
Line 13, "reciprocation" should read -- reciprocating --

Signed and Sealed this

Twenty-sixth Day of March, 2002

Attest:

*Attesting Officer*

JAMES E. ROGAN
*Director of the United States Patent and Trademark Office*